United States Patent
Mizutani et al.

(10) Patent No.: US 7,345,536 B2
(45) Date of Patent: Mar. 18, 2008

(54) AMPLIFIER CIRCUIT AND CONTROL METHOD THEREOF

(75) Inventors: Masaya Mizutani, Kasugai (JP); Koju Aoki, Kasugai (JP); Takahiro Watai, Kasugai (JP); Koji Takekawa, Kasugai (JP); Hiroyuki Sakima, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 94 days.

(21) Appl. No.: 11/181,775

(22) Filed: Jul. 15, 2005

(65) Prior Publication Data

US 2006/0208795 A1    Sep. 21, 2006

(30) Foreign Application Priority Data

Mar. 16, 2005  (JP) .............................. 2005-075589

(51) Int. Cl.
*H03G 3/20* (2006.01)
(52) U.S. Cl. ........................ 330/129; 330/279; 330/308
(58) Field of Classification Search .................... 330/2, 330/129, 279, 308
See application file for complete search history.

(56) References Cited

U.S. PATENT DOCUMENTS

| 4,133,008 A | 1/1979 | Tisue |
| 5,367,268 A * | 11/1994 | Baba ........................... 330/129 |
| 6,977,550 B2 * | 12/2005 | Ishida et al. ................. 330/279 |

FOREIGN PATENT DOCUMENTS

| JP | 06-085940 | 3/1994 |
| JP | 07-192879 | 7/1995 |

* cited by examiner

*Primary Examiner*—Khanh Van Nguyen
(74) *Attorney, Agent, or Firm*—Arent Fox, LLP

(57) ABSTRACT

An amplifier circuit which is connected to a sensor and variably sets an amplification property and a control method thereof are disclosed, the circuit having the capability of restricting the influence of change with time and temperature change. The amplifier circuit 1, which receives, as an input, a detection signal from the sensor and variably sets an amplification property, comprises: (1) a first reference value retaining unit 50 for retaining a first reference value K1 for setting an amplification property which makes an output signal be a specified detection reference output voltage when a reference input condition KJ is detected; (2) a correction signal generation unit 30 for generating a correction signal HS which reduces the difference between an amplification property actual measurement value and an amplification property set value; and (3) a first amplification property correction unit 40 for correcting the first reference value K1 based on the correction signal HS.

14 Claims, 12 Drawing Sheets

AN EXPLANATORY DIAGRAM ILLUSTRATING THE PRINCIPLE OF THE INVENTION

FIG. 1 AN EXPLANATORY DIAGRAM ILLUSTRATING THE PRINCIPLE OF THE INVENTION

A CIRCUIT BLOCK DIAGRAM OF THE FIRST EMBODIMENT

A CIRCUIT DIAGRAM SHOWING A CONCRETE EXAMPLE OF
THE MINUTE VOLTAGE GENERATION UNIT

FIG. 4 A CIRCUIT BLOCK DIAGRAM SHOWING A CONCRETE EXAMPLE OF THE AMPLIFYING UNIT

A CIRCUIT DIAGRAM SHOWING A CONCRETE EXAMPLE OF THE RESISTANCE VALUE ADJUSTING UNIT

FIG. 6 A CIRCUIT DIAGRAM SHOWING A CONCRETE EXAMPLE OF THE COMPARATOR

FIG. 7  A CIRCUIT DIAGRAM SHOWING A CONCRETE EXAMPLE OF THE ERROR SIGNAL GENERATION UNIT

A FLOW OF INITIALIZATION OF THE FIRST REFERENCE VALUE K1

A FLOW OF A METHOD OF CONTROLLING AN AMPLIFIER CIRCUIT ACCORDING TO THE FIRST EMBODIMENT

A FLOW OF A PROCEDURE OF GAIN ADJUSTMENT IN THE AMPLIFIER CIRCUIT

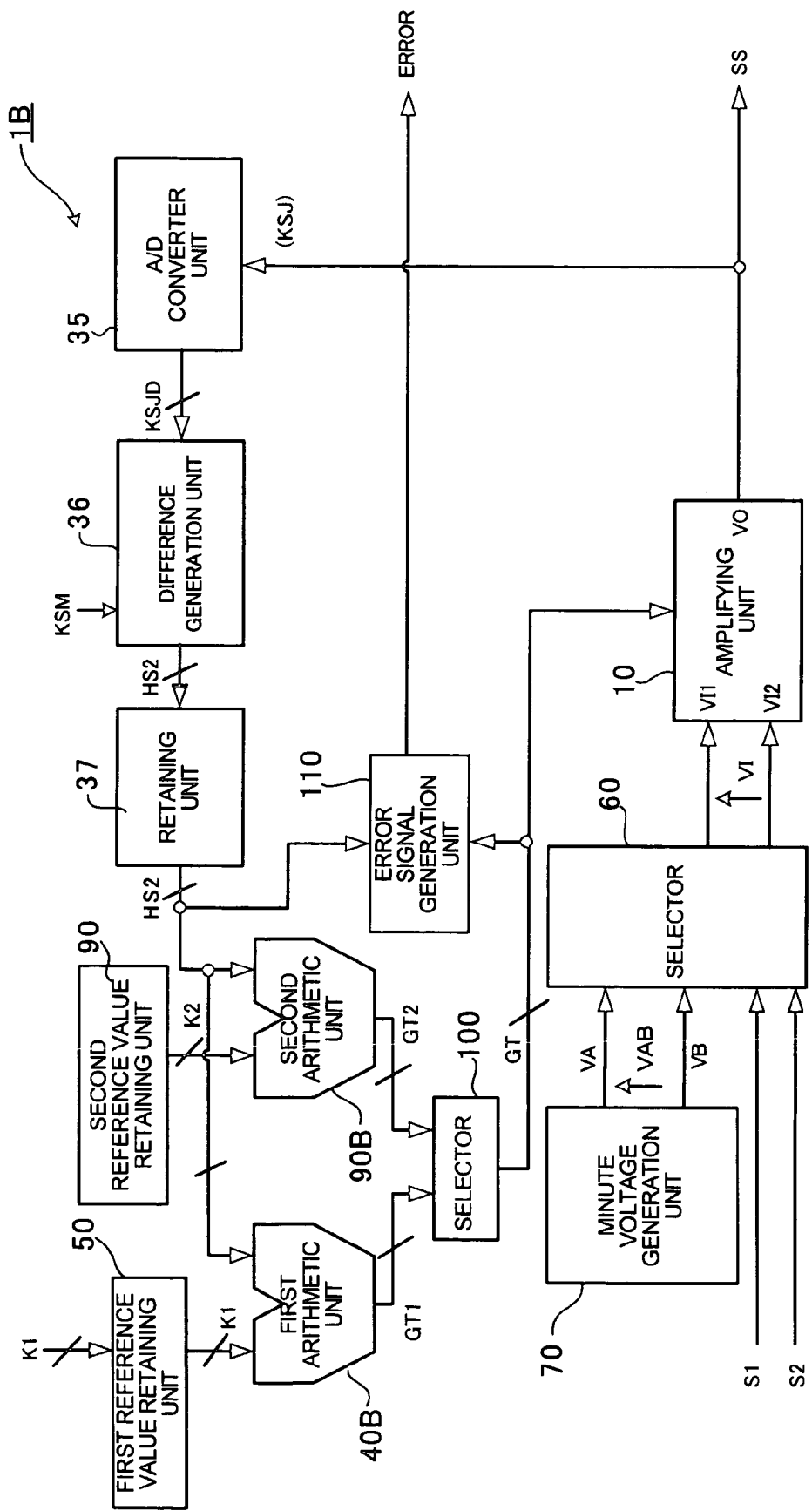
FIG. 11 A CIRCUIT BLOCK DIAGRAM OF THE SECOND EMBODIMENT

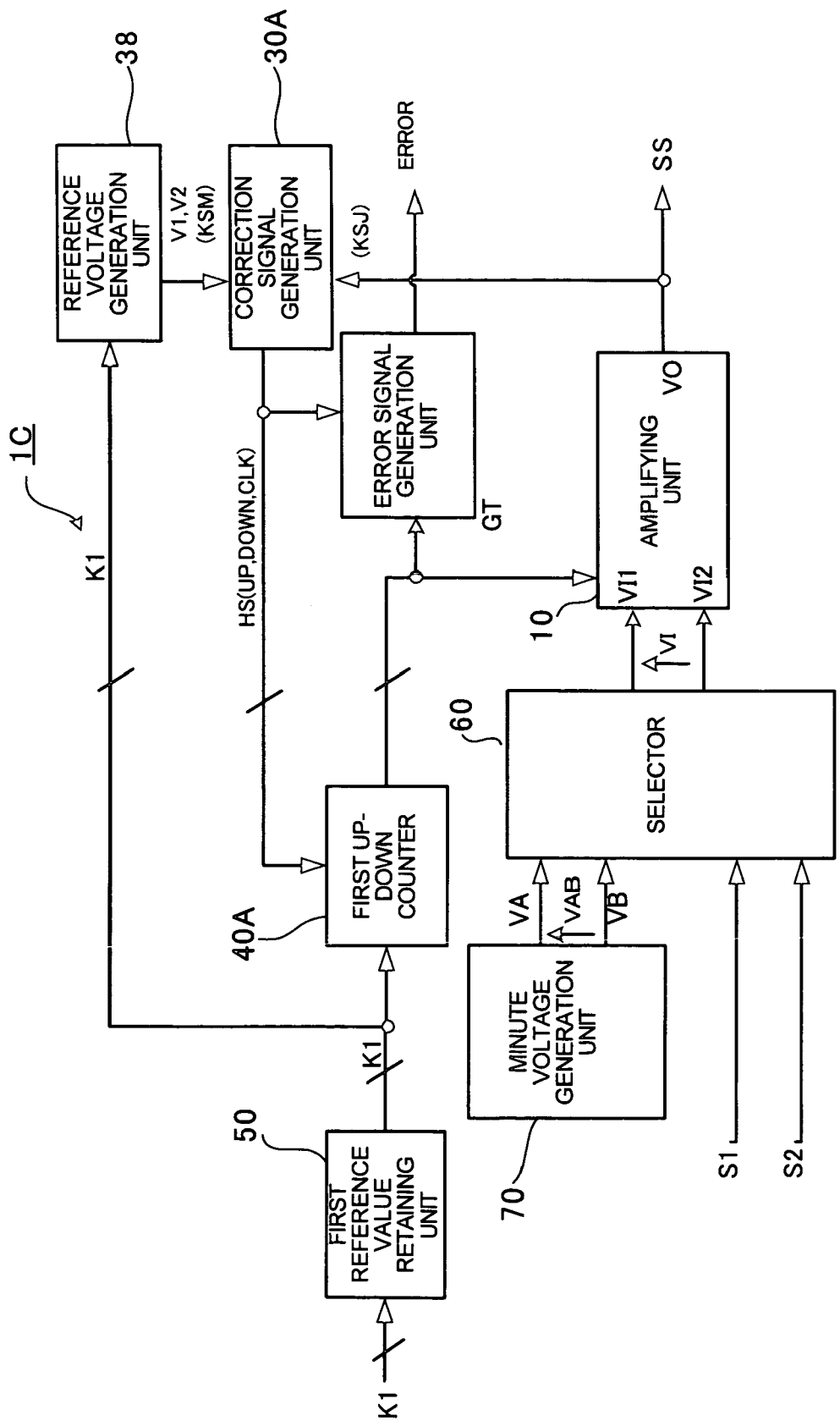
FIG. 12 CIRCUIT BLOCK DIAGRAM OF THE THIRD EMBODIMENT

AMPLIFIER CIRCUIT AND CONTROL METHOD THEREOF

CROSS-REFERENCE TO RELATED APPLICATIONS

This application is based upon and claims the benefit of priority from the prior Japanese Patent Application No. 2005-075589 filed on Mar. 16, 2005, the entire contents of which are incorporated herein by reference.

BACKGROUND OF THE INVENTION

1. Field of the Invention

The present invention relates to an amplifier circuit which is connected to a sensor and capable of variably setting an amplification property and a control method thereof.

2. Description of the Related Art

With the latest advancements in electronics technology, there have been increasingly used sensors in various scenes, which sensors output a detection signal in accordance with a change in physical quantity such as acceleration and angular speed. As sensors are more and more miniaturized and have higher sensitivity, the individual difference in sensor sensitivity tends to increase owing to manufacture variation. This leads to such a problematic situation that when a plurality of sensors detect the same change in physical quantity, there are variations in the magnitude of detection signals output from them.

To solve such a problem, a sensor is often modularized together with an amplifier circuit for amplifying the detection signal of the sensor. In this module, the amplifier circuit consists of a circuit capable of variably setting an amplification property. Upon modulation of the sensor and the amplifier circuit, an amplification property is adjusted according to the sensitivity of the sensor. More concretely, when the sensor is brought into its reference state, an amplification property of the amplifier circuit is adjusted such that the output of the amplifier circuit has a specified value. The adjusted amplification property is stored in a memory circuit such as a flash memory or ROM incorporated in the amplifier circuit, and thereafter, the detection signal of the sensor is amplified by use of the amplification property. Therefore, the module composed of such a sensor and amplifier circuit has the advantage that if the amplifier circuits of different modules detect the same change in physical quantity, they will output signals of the same magnitude so that the above-described problem of the individual difference in sensor sensitivity can be overcome. However, there still remains another problem that even though sensor sensitivity is adjusted for every module, the magnitude of signals output from the plurality of modules upon inputting of the same change varies, if the amplification property of the amplifier circuits varies owing to change with time or temperature change.

A system for adjusting an amplification property according to changes in the environment is disclosed in Japanese unexamined patent publication No. H6(1994)-85940.

This system has an amplifier circuit for amplifying an audio signal from an interphone; a reference sound generator installed in the vicinity of the interphone, for generating a reference sound of a constant level; and an amplifier circuit for amplifying an audio signal. This system further includes an A/D converter circuit for converting an audio signal into digital data; a gain adjustment look-up table in which the output data pieces of the A/D converter circuit are shown in conjunction with their corresponding gain adjustment data; and a gain adjustment circuit for adjusting the gain of the amplifier circuit.

In this system, the adjustment of an amplification property is made in the following way: First, a reference sound generated by the reference sound generator is taken in by the interphone as an audio signal which is in turn amplified by the amplifier circuit to be output as an audio signal. Then, this audio signal is converted into digital data by the A/D converter circuit and the gain adjustment data corresponding to the digital data is obtained from the gain adjustment look-up table. Then, a gain adjustment to the amplifier circuit is made based on the gain adjustment data. In the system of Japanese unexamined patent publication No. H6(1994)-85940, even if there occurs a change in the condition (e.g., the resistance of the line) of the line for connecting the reference sound generator to the interphone, the influence of the change of the line condition can be eliminated because gain is adjusted through the line based on the audio signal corresponding to the reference sound.

The technique for gain adjustment of an amplifier circuit disclosed in Japanese unexamined patent publication No. H6(1994)-85940 can be utilized, by replacing the interphone incorporated in the system of Japanese unexamined patent publication No. H6(1994)-85940 with the sensor of the above-described module constituted by a sensor and an amplifier circuit.

More specifically, if the module composed of a sensor and an amplifier circuit is provided with a sensor reference input device for inputting a reference physical quantity to a sensor which input device is equivalent to the reference sound generator of Japanese unexamined patent publication No. H6(1994)-85940, an amplification property of the amplifier circuit can be adjusted based on an output signal obtained upon inputting of the reference physical quantity to the sensor, similarly to the system disclosed in Japanese unexamined patent publication No. H6(1994)-85940.

SUMMARY OF THE INVENTION

The sensor reference input device described above, however, requires a means for accurately generating a specified value indicative of a physical quantity detected by the sensor, which disadvantageously leads to an increase in the size of the module and in cost.

The present invention is directed to overcoming at least one of the foregoing problems discussed in BACKGROUND OF THE INVENTION and a primary object of the invention is therefore to provide an amplifier circuit which is connected to a sensor and capable of variably setting an amplification property and its control method, the amplifier circuit being capable of restraining the influence of change with time and temperature change.

In order to achieve the above object, according to a first aspect, there is provided an amplifier circuit which receives, as an input, a detection signal from a sensor and variably sets an amplification property, the circuit comprising a first reference value retaining unit for retaining a first reference value for setting an amplification property which makes an output signal be a specified detection reference output voltage when a reference input condition where a reference physical quantity is input to the sensor is detected, a correction signal generation unit for generating a correction signal which reduces the difference between an amplification property actual measurement value and a specified amplification property set value, where the amplification property actual measurement value is a measurement value of an input/output property when the specified amplification property set value is set, and a first amplification property correction unit for correcting the first reference value based on the correction signal.

Also, according to the first aspect, there is provided a method of controlling an amplifier circuit which receives, as an input, a detection signal from a sensor and variably sets an amplification property, the method comprising the steps of retaining a first reference value for setting an amplification property which makes an output signal be a specified detection reference output voltage when a reference input condition where a reference physical quantity is input to the sensor is detected, generating a correction signal for reducing the difference between an amplification property actual measurement value and a specified amplification property set value, where the amplification property actual measurement value is a measurement value of an input/output property when the specified amplification property set value is set, and correcting the first reference value based on the correction signal.

In the amplifier circuit of the invention, an amplification property which has been corrected based on a correction signal is set for a first reference value which is an amplification property set value. The correction signal is generated so as to reduce the difference between an amplification property actual measurement value and the amplification property set value. That is, by correcting the amplification property based on the correction signal, the deviation of the actual value of the input/output property when the amplification property set value is set from the amplification property set value can be eliminated, the deviation being caused by change with time or temperature change. As a result, an error in the output signal of the amplifier circuit can be restricted.

The amplification property is an electrical property representative of the relationship between the input signal and output signal of the amplifier circuit, such as amplification degree and offset voltage. One example of the amplifier circuit capable of variably setting the amplification property, that is, amplification degree is a negative feed-back circuit capable of adjusting the amount of negative feed-back. One example of the amplifier circuit capable of variably setting the amplification property, that is, offset voltage is an operational amplifier capable of setting offset voltage through application of voltage to a non-inversion input terminal of the operational amplifier.

The sensor is an apparatus which detects a change in physical quantity to output a detection voltage. More concretely, examples of the sensor include acceleration sensors for detecting changes in acceleration; angular speed sensors for detecting changes in angular speed or inclination; temperature sensors for detecting changes in temperature; pneumatic sensors and pressure sensors for detecting changes in air pressure; and optical sensors for detecting changes in light intensity or variations in color shade.

The first reference value retaining unit may be a unit of any kind as long as it can retain the contents of the first reference value. Examples of the first reference value retaining unit include non-volatile memories such as ROM and flash memories. Volatile memories such as RAM and registers may be used as the first reference value retaining unit, by arranging them such that the contents are set whenever the system starts up. In cases where the amplifier circuit is mounted on an IC or the like, the first reference value may be generated, using a combination of input terminals connected to a power source or the ground. Therefore, these input terminals may be used as the first reference value retaining unit.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 11 is a circuit block diagram of the second embodiment; and

FIG. 12 is a circuit block diagram of the third embodiment.

DETAILED DESCRIPTION OF THE PREFERRED EMBODIMENTS

Referring now to FIGS. 1 to 12, an amplifier circuit and its control method will be explained according to preferred embodiments of the invention.

First Embodiment

Figure 1:
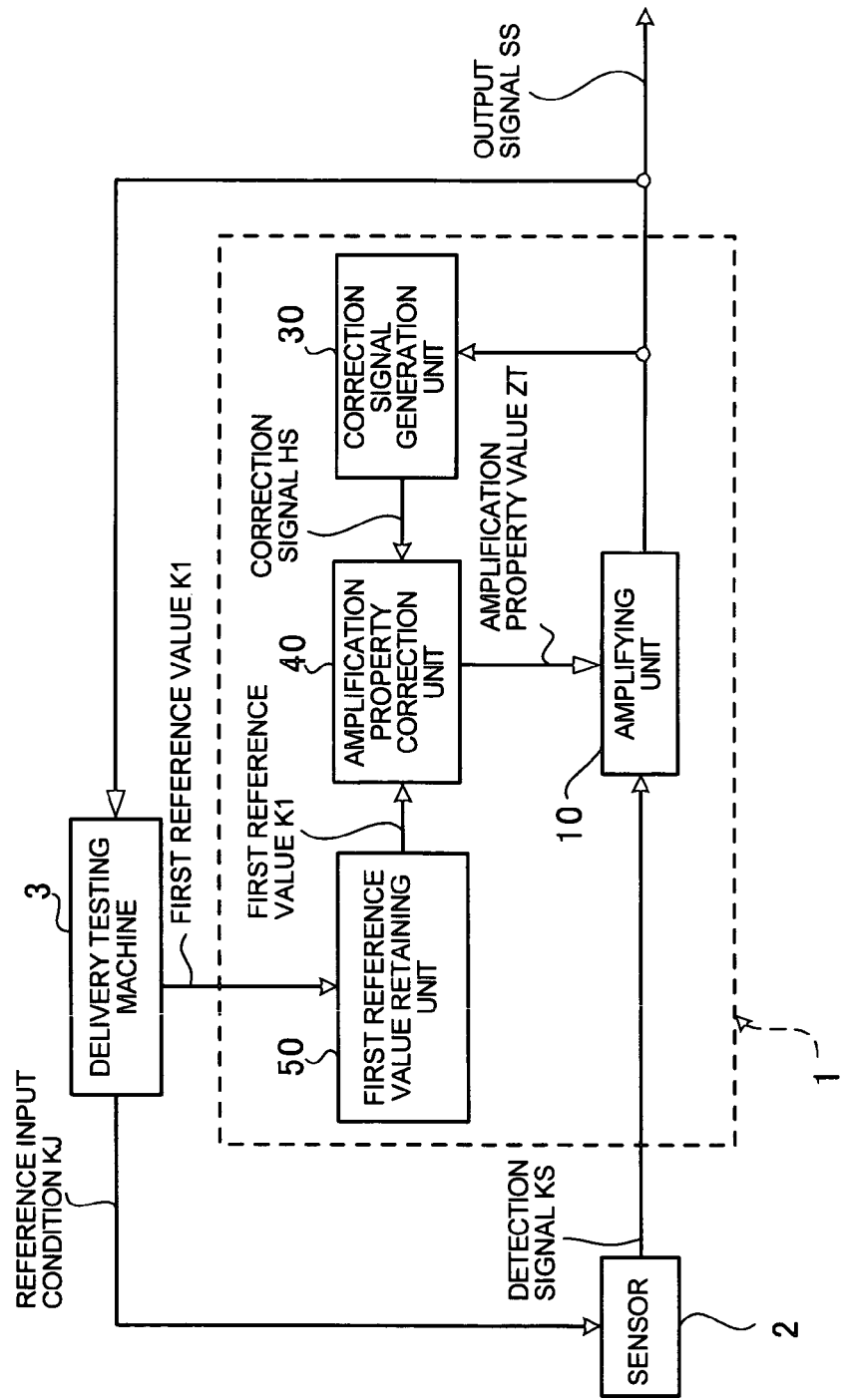
FIG. 1 is an explanatory diagram illustrating the principle of the invention.

FIG. 1 is a principle diagram illustrating an amplifier circuit 1 according to the invention. FIG. 1 shows a sensor 2; an amplifier circuit 1 connected to the sensor 2, for amplifying a detection signal KS from the sensor 2 to output; a delivery testing machine 3 for measuring the properties of the amplifier circuit 1 in a condition where the sensor 2 is connected to it.

The amplifier circuit 1 includes an amplifying unit 10 for variably setting an amplification property; a first reference value retaining unit 50 for retaining a first reference value K1 which is a preset amplification property value; a correction signal generation unit 30 for generating a correction signal HS; and a first amplification property correction unit 40 for correcting the first reference value K1 based on the correction signal HS and outputting a corrected amplification property value ZT to the amplifying unit 10. Among these units, the correction signal generation unit 30 obtains an amplification property actual measurement value which is a measurement of the input/output property when a specified amplification property set value is set, and generates the correction signal HS for reducing the deviation of the amplification property actual measurement value from the amplification property set value.

The sensor 2 may be any sensor as long as it can output the detection signal KS according to changes in physical quantity imposed on itself. Concretely, it may be, for instance, an acceleration sensor for outputting the detection signal KS according to acceleration imposed on itself or an angular speed sensor for outputting the detection signal KS according to changes in angular speed.

Before shipment of the amplifier circuit 1, the delivery testing machine 3 determines the first reference value K1 which is an amplification property value of the amplifier circuit 1, based on the result of measurement of the amplification property of the amplifier circuit 1 in a condition where the sensor 2 is connected to it. Then, the testing machine 3 stores the first reference value K1 in the first reference value retaining unit 50 of the amplifier circuit 1. The first reference value K1 is an amplification property value for setting the amplification property which makes an output signal SS from the amplifying unit 10 be a specified reference output voltage when the sensor 2 detects a reference input condition KJ.

If the correction based on the correction signal HS is not made, the amplifier circuit 1 amplifies the detection signal KS with the amplification property corresponding to the first reference value K1 and outputs the output signal SS. Therefore, if change with time or temperature change occurs in the amplifier circuit 1, the actual value of the input/output property when the first reference value K1 is set will deviate from the preset, first reference value K1. Therefore, the preset, first reference value K1 cannot accurately reflect upon the amplification property, which results in error in the output of the amplifier circuit 1.

Even in such a case, the amplifier circuit 1 according to a first embodiment can set the amplification property, which has been corrected based on the correction signal HS, for the first reference value K1, that is, the preset, amplification property value. As described earlier, the correction signal HS is generated so as to reduce the difference between the amplification property set value and the amplification property actual measurement value. More specifically, the amplification property is corrected based on this correction signal, thereby eliminating the difference between the amplification property set value and the actual value of the input/output property when the amplification property set value is set, the difference being caused by change with time or temperature change. As a result, error in the output signal SS to be released from the amplifier circuit 1 can be restricted.

Figure 2:
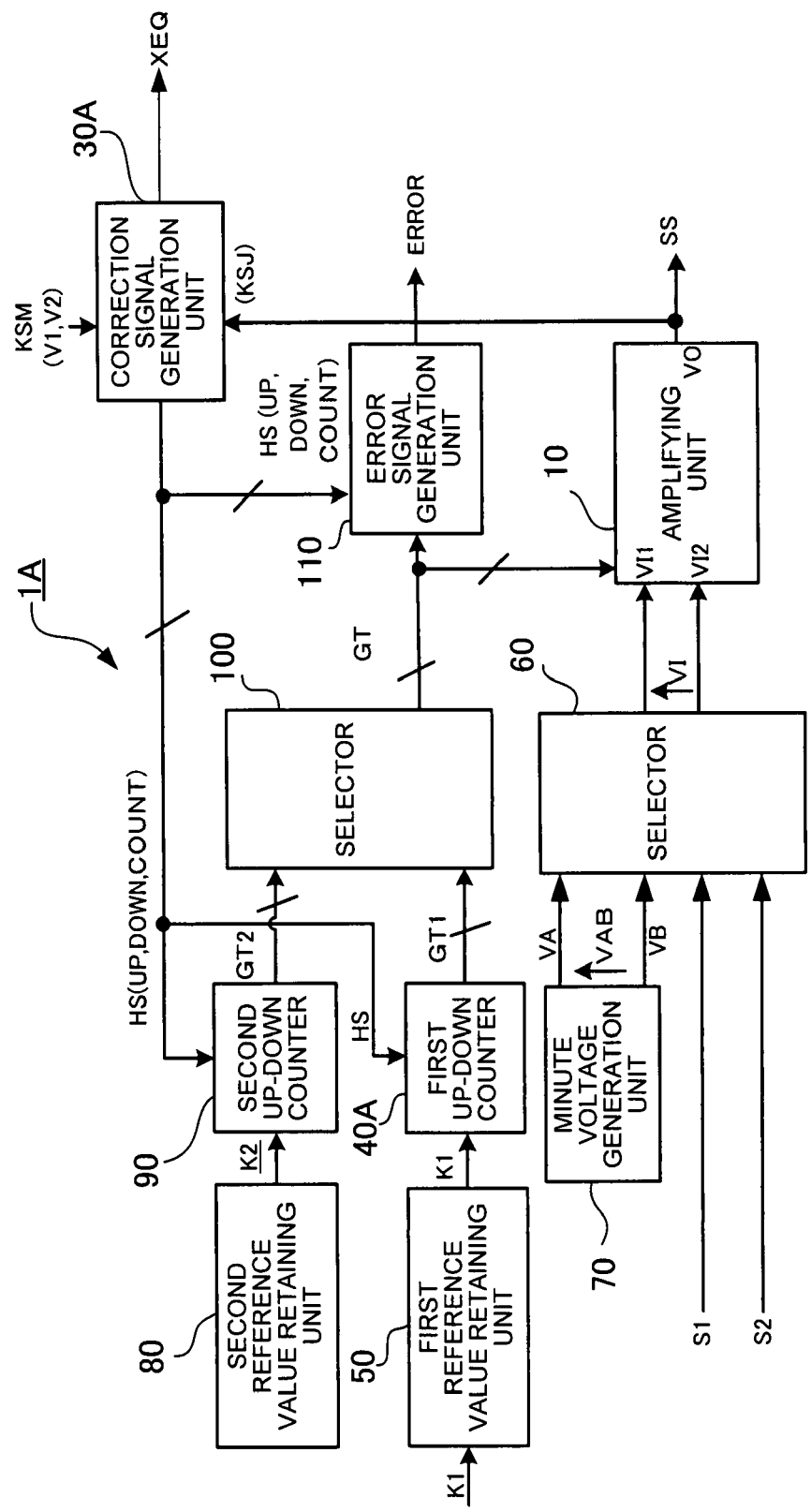
FIG. 2 is a circuit block diagram of the first embodiment.

FIG. 2 shows an amplifier circuit 1A constructed based on the principle diagram of FIG. 1.

The amplifier circuit 1A has the amplifying unit 10; the first reference value retaining unit 50 for retaining the first reference value K1 which is a preset gain value; a correction signal generation unit 30A for generating the correction signal HS; and a first up-down counter 40A (first amplification property correction unit) for correcting the first reference value K1 based on the correction signal HS and outputting a corrected gain value GT (corrected amplification property value ZT) to the amplifying unit 10. Further, the amplifier circuit 1A includes a second reference value retaining unit 80 for retaining a specified, second reference value K2; and a second up-down counter 90 (second amplification property correction unit) for correcting the second reference value K2 based on the correction signal HS.

A selector 60 selects either a set of detection signals S1, S2 (=a pair of differential voltages) from the sensor or a set of reference potentials VA, VB to input to input terminals VI1, VI2 of the amplifying unit 10. The amplifier unit 10 amplifies an input potential difference VI, which has been input to the input terminals VI1, VI2, to output as the output signal SS.

Figure 3:
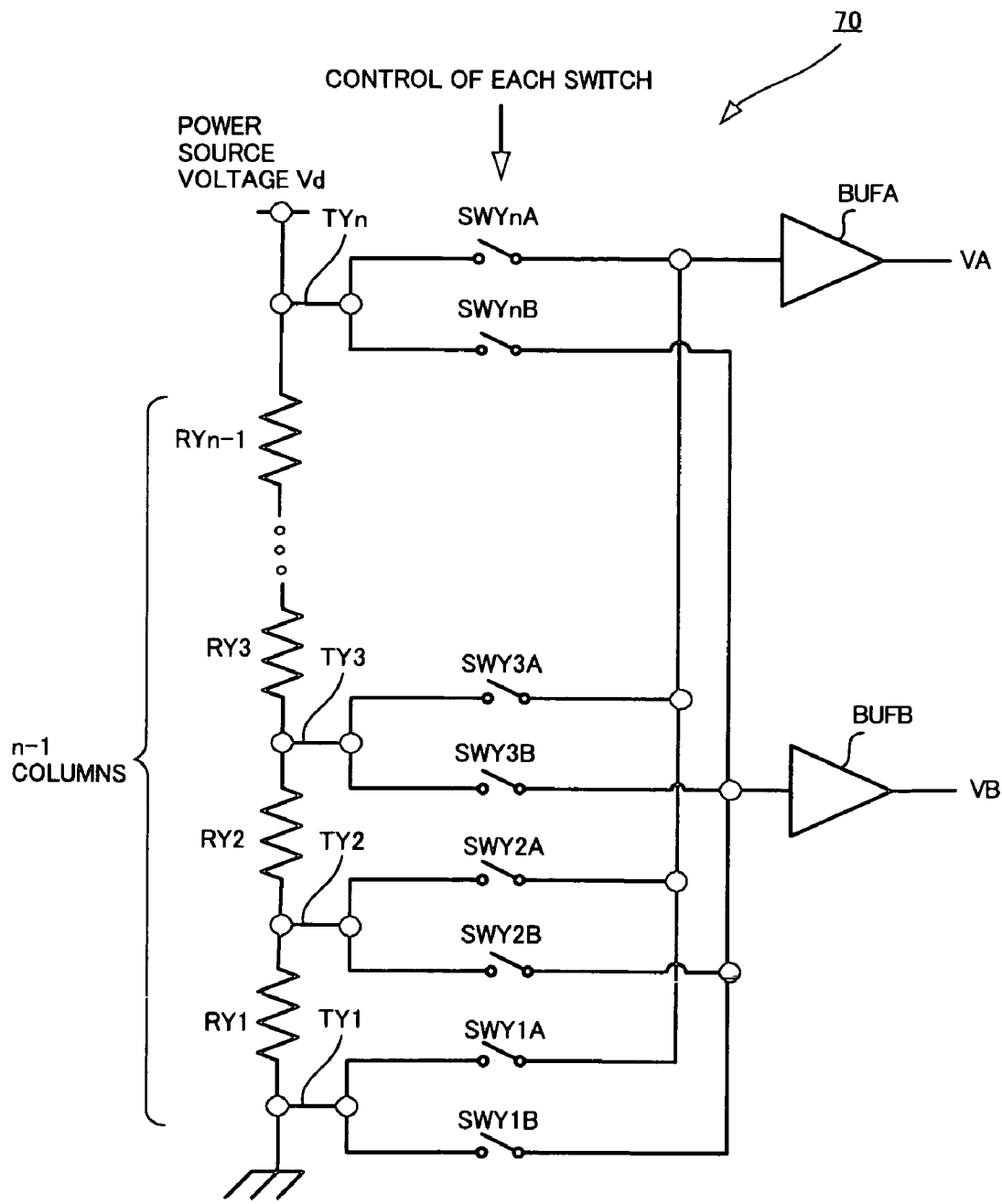
FIG. 3 is a circuit diagram showing a concrete example of the minute voltage generation unit.

The reference potentials VA, VB are generated in a minute voltage generation unit 70. FIG. 3 concretely shows a circuit of the minute voltage generation unit 70. Resistor elements RY1 to RYn–1 arranged in n–1 columns are serially connected between a power supply voltage Vd and the ground GND. Intermediate taps TY1 to TYn are brought out of the connection nodes, respectively. Connected to each intermediate tap is one end of each of a pair of switches. Connected to the other ends of the pair of switches are buffers BUFA, BUFB. For example, one end of each of switches SWY1A, SWY1B is connected to the intermediate tap TY1. The buffer BUFA is connected to the other end of the switch SWY1A, whereas the buffer BUFB is connected to the other end of the switch SWY1B.

Further, only one of the switches SWY1A to SWYnA is turned ON, whereas others are turned OFF. Since the switches are thus controlled, the potential of the intermediate tap connected to the switch which has been turned ON is output through the buffer BUFA as the reference potential VA. For instance, if the switch SWY3A is turned ON, the potential of the intermediate tap TY3 is output as the reference potential VA.

The switches SWY1B to SWYnB are likewise controlled, and therefore the potential of the intermediate tap connected to a switch turned ON is likewise output as the reference potential VB.

In this specification, the potential difference between the reference potentials VA and VB is referred to as "reference voltage VAB".

Figure 4:
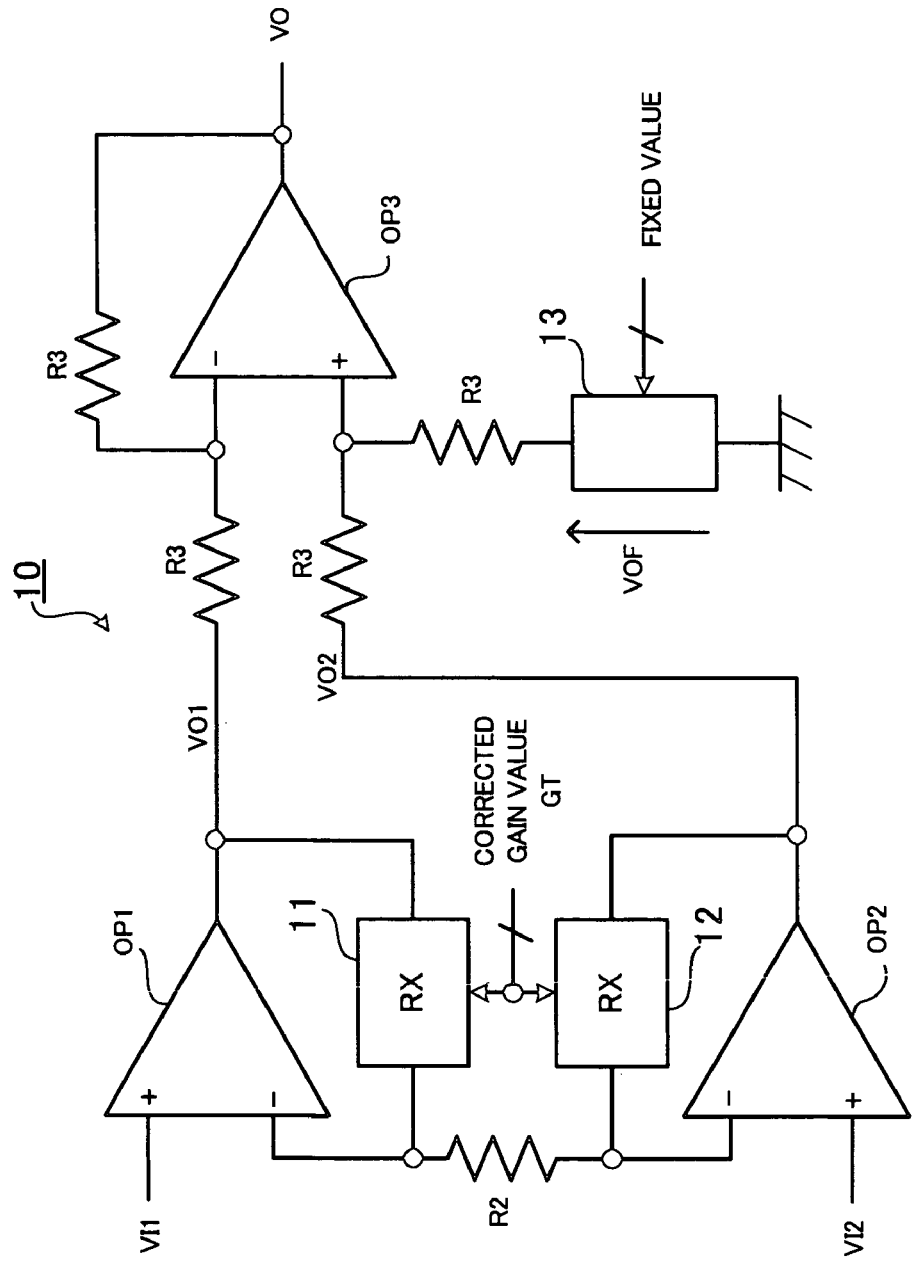
FIG. 4 is a circuit block diagram showing a concrete example of the amplifying unit.
Figure 5:
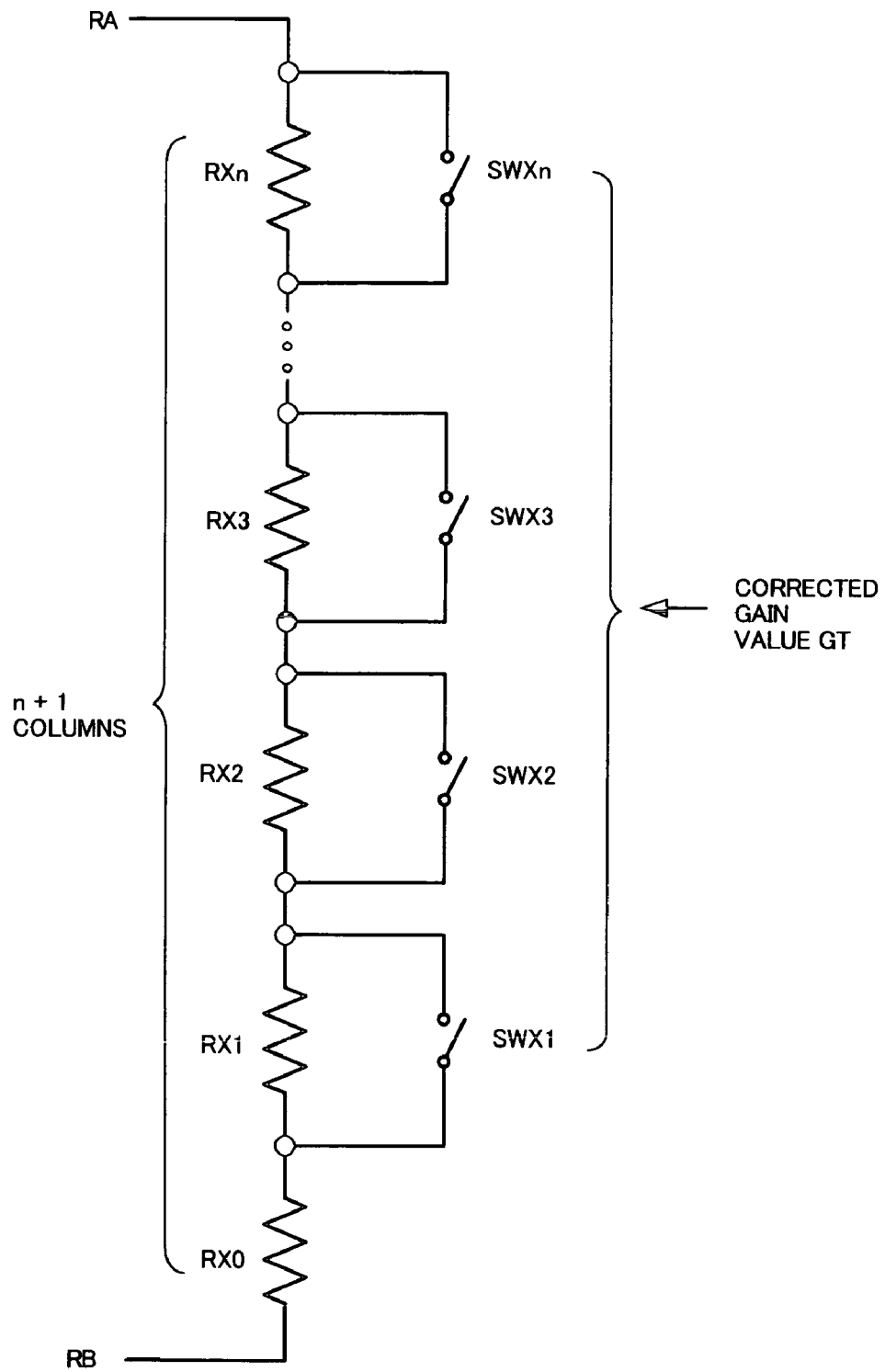
FIG. 5 is a circuit diagram showing a concrete example of the resistance value adjusting unit.

Next, a concrete example of the amplifier unit 10 is shown in FIG. 4.

The amplifier unit 10 has three known operational amplifiers OP1 to OP3; resistor adjusting units 11, 12 for making gain adjustment to the operational amplifiers OP1, OP2; a minute voltage generation unit 13 for making offset adjustment to the operational amplifier OP3; and resistor elements R2, R3.

Of these components, the minute voltage generation unit 13 can be composed of a circuit similar to the circuit of the minute voltage generation unit 70 (see FIG. 3).

The operational amplifiers OP1, OP2 constitute a negative feed-back amplifier circuit in cooperation with the resistor adjusting units 11, 12 which vary with the same resistance value and the resistor element R2. The units 11, 12 and the element R2 serve as a negative feed-back resistance. The operational amplifier OP3 is a negative feed-back amplifier circuit having gain=1 and the offset of the output VO of the operational amplifier OP3 is adjusted by the offset voltage VOF of the minute voltage generation unit 13 connected to the non-inversion input terminal (+).

The gain G and output VO of the amplifying unit 10 thus configured are described by the following equations (1) and (2):

$$\text{Gain } G=(RX/R2*2)+1 \qquad \text{Equation (1)}$$

$$\text{Output } VO=VOF+(VI1-VI2)*G \qquad \text{Equation (2)}$$

where the resistance value of the resistor adjusting units 11, 12 is RX.

Therefore, the gain G can be set by adjusting the resistance value RX of the resistor adjusting units 11, 12 and the offset of the output VO can be set by adjusting the offset voltage VOF of the minute voltage generation unit 13.

The first embodiment exemplifies a case where adjustment is made only to the gain G. Therefore, the offset voltage VOF is fixed to a specified voltage value.

The resistor adjusting units 11, 12 are a circuit capable of variably setting a resistance value by the corrected gain value GT. Concretely, they consist of the circuit shown in FIG. 5.

This circuit includes resistor elements RX0 to RXn which are arranged in n+1 columns and serially connected; and switches SWX1 to SWXn which create a short-circuit across the resistor elements RX1 to RXn out of RX0 to RXn. The switches SWX1 to SWXn are turned ON and OFF by the corrected gain value GT. If one of the switches is turned ON, the value of resistance across its associated resistor element becomes zero. Since the (combined) resistance value RX between terminals RA, RB is a sum of the values of resistance of the resistor elements RX0 to RXn, it varies according to combinations of the switches turned ON or OFF by the corrected gain value GT. That is, the resistance value RX between the terminals RA and RB can be variably set by the corrected gain value GT.

The resistor adjusting units 11, 12 of the first embodiment use a circuit composed of the resistor elements RX1 to RX5 in five columns. The corrected gain value GT given to the resistor adjusting unit 11 is a sequence of 5-bit, binary data 00000 to 11111.

In the resistor adjusting units 11, 12, the resistance values of the resistor elements RX0 to RX5 are set such that the corrected gain value GT corresponds to the gain G of the amplifying unit 10. More specifically, when the corrected gain value GT is 00000, the gain G becomes 1000, and when the corrected gain value GT is 00001, the gain G becomes 1010. Each time the corrected gain value GT is incremented by one, the gain G is incremented by 10, so that when the gain correction value is 11111, the gain G is 1310. To this end, the resistance values of the resistor elements RX0 to RX5 are set as follows based on Equation (1): $RX0=R2*999/2$; $RX1=R2*9/2$; $RX2=R2*19/2$; $RX3=R2*39/2$; $RX4=R2*79/2$; $RX5=R2*1599/2$.

Turning back to FIG. 2, the amplifier circuit 1A includes the first reference value retaining unit 50 in which the first reference value K1 is stored beforehand and the second reference value retaining unit 80 in which the second reference value K2 is stored beforehand. The first reference value retaining unit 50 consists of a known flash memory because the first reference value K1 is not constant. The second reference value retaining unit 80 consists of a known clipper circuit because the second reference value K2 is a constant value. The first reference value retaining unit 50 outputs the first reference value K1 to the first up-down counter 40A, whereas the second reference value retaining unit 80 outputs the second reference value K2 to the second up-down counter 90.

The first up-down counter 40A and second up-down counter 90, which respectively consist of a known up-down counter, are initially loaded with the first reference value K1 and the second reference value K2 respectively as required at the time such as when the power source is turned ON. According to control outputs UP, DOWN and a count signal COUNT (the correction signal HS), they count up or down to correct the contents and output gain values GT1 and GT2. Specifically, if the control output UP is at a high level, the contents will be incremented by one (+1) according to the clock of the count signal COUNT, and if the control output DOWN is at a high level, the contents will be decremented by one (−1) according to the clock of the count signal COUNT.

A selector 100 selects either the gain value GT1 or the gain value GT2 and sets up the corrected gain value GT in the amplifying unit 10. Also, the corrected gain value GT is output to an error signal generation unit 110.

The correction signal generation unit 30A makes a comparison between a reference output voltage target value KSM and a reference output voltage actual measurement value KSJ, the target value KSM being preset based on the relationship between the second reference value K2 and the reference voltage VAB. Based on the result of the comparison, the unit 30A outputs the correction signal HS. The reference output voltage actual measurement value KSJ is a measurement of the voltage of the output signal SS which is output from the amplifying unit 10 when the gain value GT2 is set and the reference voltage VAB is input.

In this specification, the upper limit and lower limit of the reference output voltage target value KSM are referred to as a reference output voltage target upper limit V1 and a reference output voltage target lower limit V2, respectively. Therefore, the state where the reference output voltage actual measurement value KSJ matches the reference output voltage target value KSM is such a condition that the reference output voltage actual measurement value KSJ takes a voltage value falling in the range of from the reference output voltage target lower limit V2 to the reference output voltage target upper limit V1.

Figure 6:
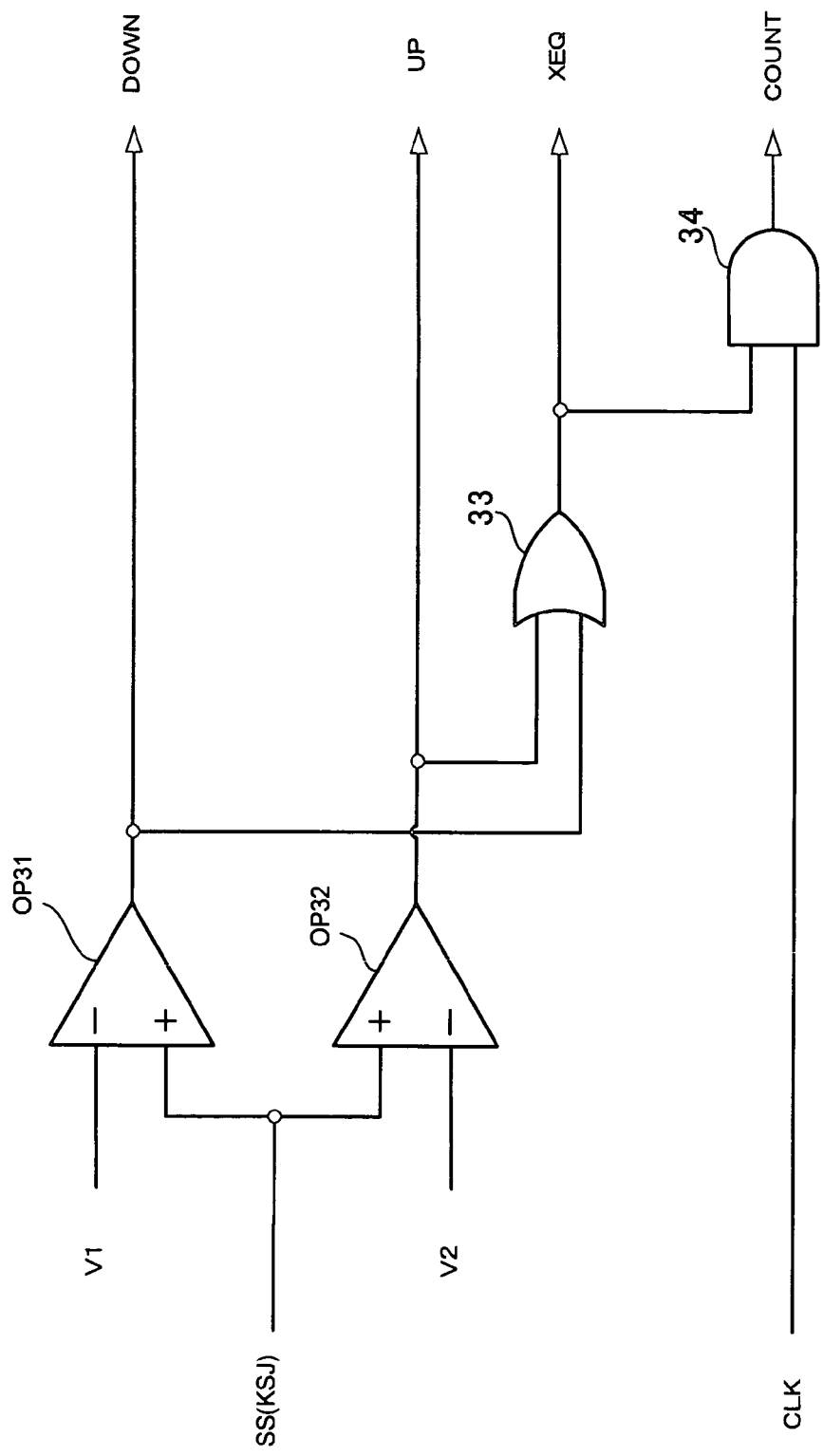
FIG. 6 is a circuit diagram showing a concrete example of the comparator.

FIG. 6 concretely shows a circuit diagram of a comparator. The correction signal generation unit 30A including the comparator receives as an input: the reference output voltage target upper limit V1; the reference output voltage target lower limit V2; the output signal SS of the amplifying unit 10; and a clock signal CLK. The correction signal generation unit 30A has two operational amplifiers 31, 32; an OR gate 33; and an AND gate 34. The correction signal generation unit 30A compares the reference output voltage actual measurement value KSJ which is a voltage value of the output signal SS with the reference output voltage target upper limit V1 and the reference output voltage target lower limit V2 respectively. With this comparison, the unit 30A determines whether the reference output voltage actual measurement value KSJ falls within the range of from the reference output voltage target lower limit V2 to the reference output voltage target upper limit V1, and more particularly, whether the reference output voltage actual measurement value KSJ matches the reference output voltage target value KSM. The reference output voltage target upper limit V1 and the reference output voltage target lower limit V2 can be generated by employing the same circuit configuration as that of the minute voltage generation unit 70 (see FIG. 3).

The operational amplifier 31 makes a judgment by comparing the reference output voltage target upper limit V1 with the voltage value of the output signal SS and then outputs a control output DOWN. More specifically, if the reference output voltage target upper limit V1>the output signal SS, the operational amplifier 31 outputs a low level as the control output DOWN and if the reference output voltage target upper limit V1<the output signal SS, the operational amplifier 31 outputs a high level as the control output DOWN.

The operational amplifier 32 makes a judgment by comparing the reference output voltage target lower limit V2 with the voltage value of the output signal SS and then outputs a control output UP. More specifically, if the reference output voltage target lower limit V2<the output signal SS, the operational amplifier 32 outputs a low level as the control output UP and if the reference output voltage target upper limit V2>the output signal SS, the operational amplifier 32 outputs a high level as the control output UP.

The OR gate 33 performs OR logic operation on the outputs of the operational amplifiers 31, 32 and outputs a control output XEQ. The operational amplifiers 31, 32 output a low level if the voltage value of the output signal SS falls within the range of from the reference output voltage target lower limit V2 to the reference output voltage target upper limit V1. Therefore, the control output XEQ goes to a low level if the voltage value of the output signal SS falls within the range of from the reference output voltage target lower limit V2 to the reference output voltage target upper limit V1, that is, if the reference output voltage actual measurement value KSJ matches the reference output voltage target value KSM.

The control output XEQ is output to a control unit (not shown) to be used for determining whether or not the correction signal HS will be generated in the control unit.

The AND gate 34 performs AND logical operation on the control output XEQ and the clock signal CLK, and outputs a count signal COUNT. While the control output XEQ is at a high level, that is, while the voltage value of the output signal SS falls within the range of from the reference output voltage target lower limit V2 to the reference output voltage target upper limit V1, the clock signal CLK is output as the count signal COUNT.

As described above, the control outputs UP, DOWN and COUNT, which are generated by the correction signal generation unit 30A, are output, as the correction signal HS, to the first up-down counter 40A, the second up-down counter 90 and the error signal generation unit 110.

Figure 7:
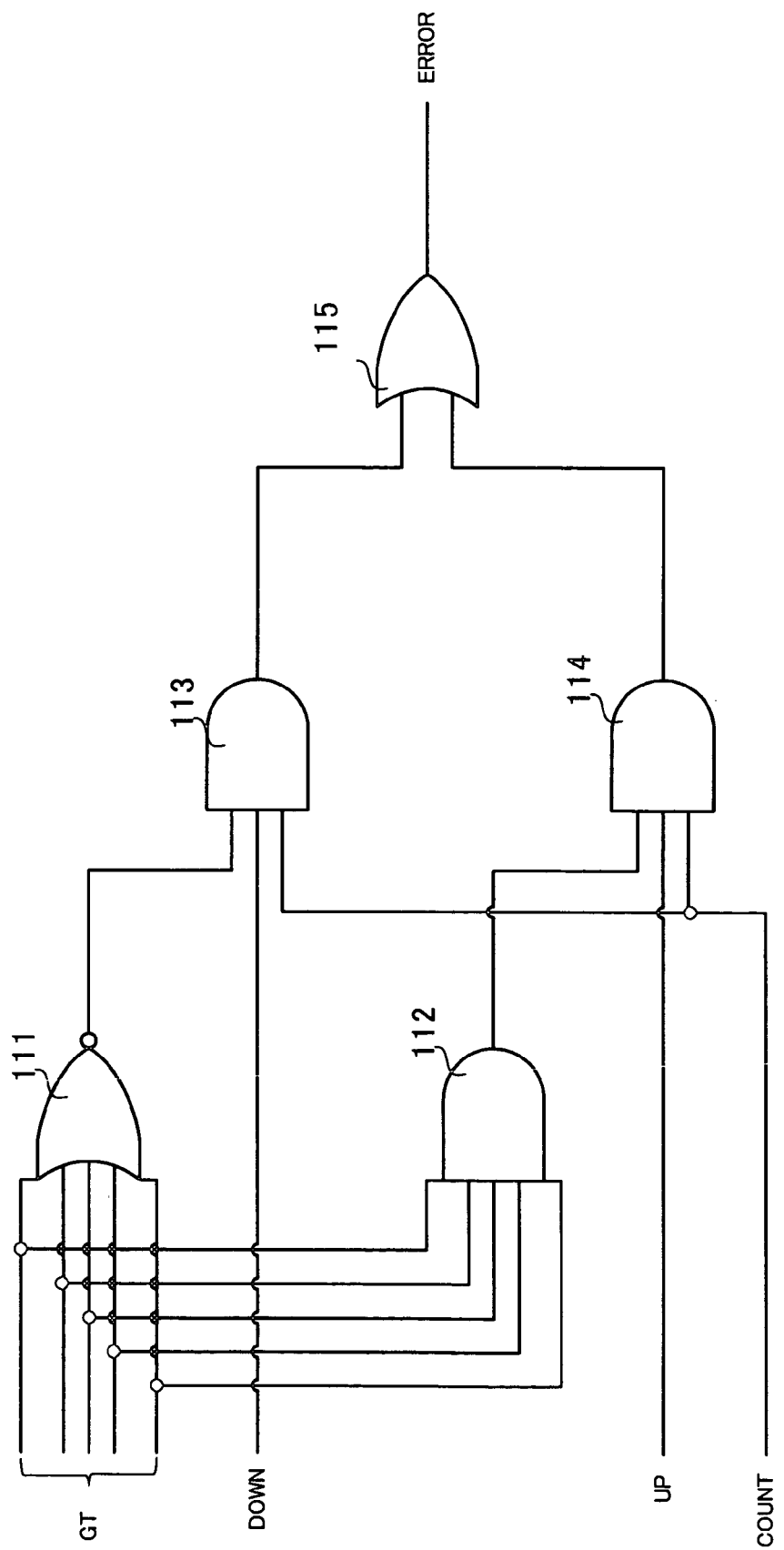
FIG. 7 is a circuit diagram showing a concrete example of the error signal generation unit.

Then, the error signal generation unit 110 generates an error signal ERROR indicative of occurrence of an error based on the corrected gain value GT and the correction signal HS (the control outputs UP, DOWN and COUNT). FIG. 7 concretely shows a circuit diagram of the error signal generation unit 110.

The error signal generation unit 110 has a 5-input NOR gate 111; a 5-input NAND gate 112; two 3-input AND gates 113, 114; and an OR gate 115. Input to both of the 5-input NOR gate 111 and 5-input NAND gate 112 is the corrected gain value GT which is 5-bit binary data.

The 5-input NOR gate 111 outputs a high level, while all the bits of the corrected gain value GT are at a low level. The 5-input NAND gate 112 outputs a high level, while all the bits of the corrected gain value GT are at a high level.

The 3-input AND gate 113 performs AND logic operation on the output of the 5-input NOR gate 111, the control output DOWN and the count signal COUNT. The 3-input AND gate 114 performs AND logic operation on the output of the 5-input NAND gate 112, the control output UP and the count signal COUNT. Further, the OR gate 115 performs OR logic operation on the 3-input AND gate 113 and the 3-input AND gate 114.

In the above configuration, the error signal generation unit 110 outputs the count signal COUNT as the error signal ERROR, if all the bits of the corrected gain value GT are at a low level (the lower limit of the corrected gain value GT) and the control output DOWN is at a high level (i.e., the correction signal indicates correction to a higher value) or if all the bits of the corrected gain value GT are at a high level (the upper limit of the corrected gain value GT) and the control output UP is at a high level (i.e., the correction signal indicates correction to a lower value).

Figure 8:
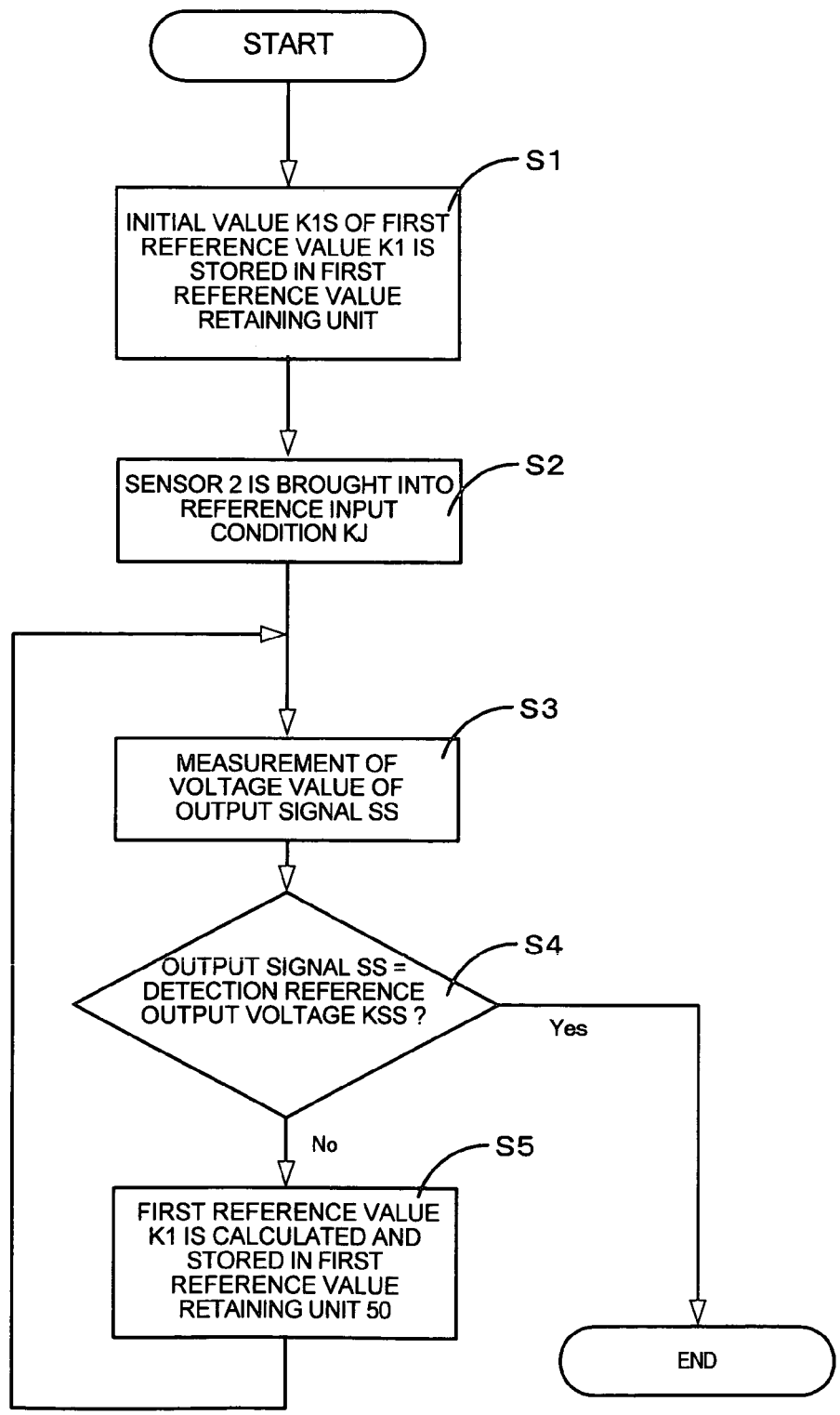
FIG. 8 is a flow of initialization of the first reference value k1.

Next, reference is made to FIG. 8 to explain how to initialize the first reference value K1 for determining the first reference value K1 and storing the first reference value K1 in the reference value retaining unit 50.

First, at Step S1, the initial value K1S of the first reference value K1 is stored in the first reference value retaining unit 50. This initial value K1S may be any value, but a value close to the target value such as past results is preferably used, because it enables quick determination of the first reference value K1.

Then, at Step S2, the sensor 2 is brought into the reference input condition KJ. Concretely, a specified physical quantity is input to the sensor 2 by applying a constant pressure from the outside of the sensor 2.

Then, at Step S3, the output signal SS is measured and at step S4, the measurement result of the output signal SS is compared to a preset, specified detection reference output voltage KKS.

If it is determined from the result of the comparison that the voltage of the output signal SS is substantially equal to the detection reference output voltage KKS, the initialization of the first reference value K1 is ended. Otherwise, the program proceeds to step S5.

At Step S5, the first reference value K1 is calculated based on the difference between the output signal SS and the detection reference output voltage KKS and this calculated value K1 is stored in the first reference value retaining unit 50. After the storing, the program returns to Step S3 to adjust the first reference value K1 again.

With the above procedure, the first reference value K1 for setting the gain by which the output signal SS becomes the specified detection reference output voltage KKS when the sensor 2 detects the reference input condition KJ is determined, and this first reference value K1 is stored in and retained by the first reference value retaining unit 50 of the amplifier circuit 1A.

Figure 9:
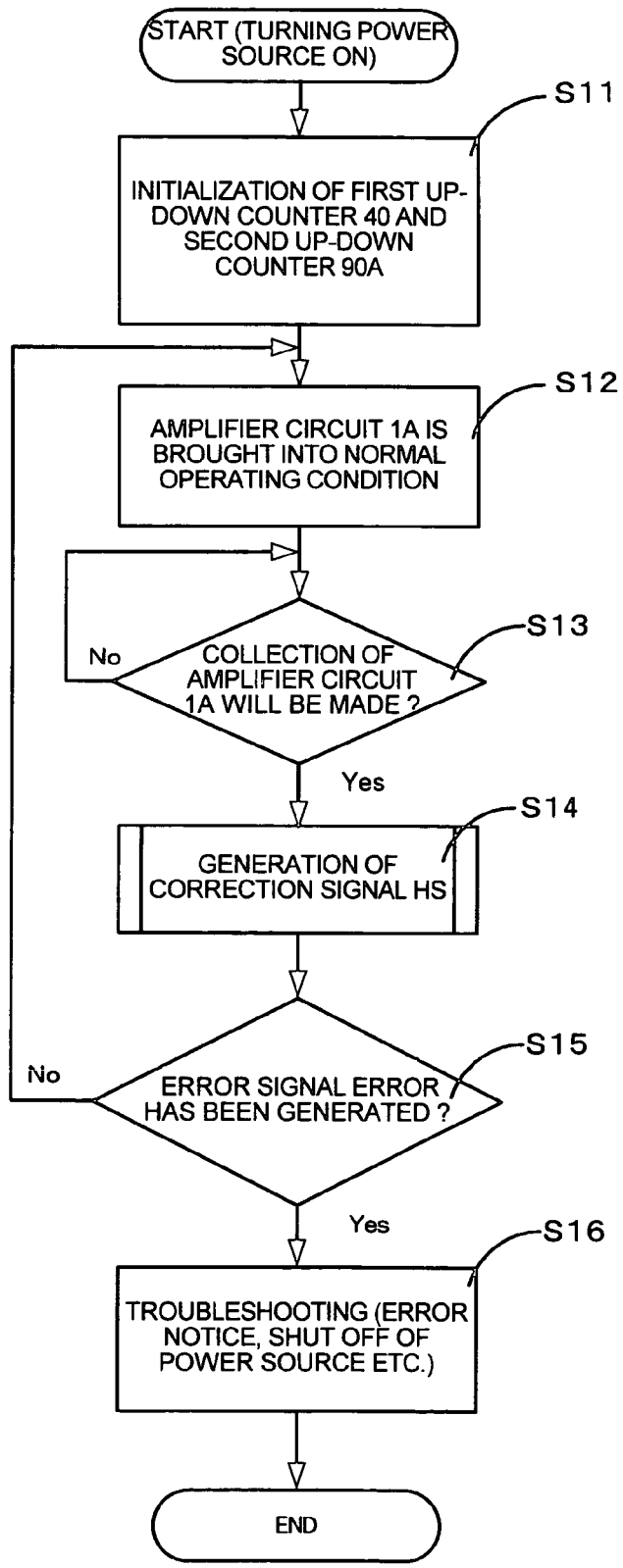
FIG. 9 is a flow of a method of controlling an amplifier circuit according to the first embodiment.

Next, reference is made to FIG. 9 for concretely explaining a method of controlling the amplifier circuit 1A while the first reference value K1 being retained by the first reference value retaining unit 50.

At Step S11 just after turning the power source ON, the first up-down counter 40A and the second up-down counter 90 are initialized. More concretely, the first up-down counter 40A is initially loaded with the first reference value K1, whereas the second up-down counter 90 is initially loaded with the second reference value K2.

Then, at Step S12, the amplifier circuit 1A is brought into a normal operation condition. The normal operation condition is such a state that the amplifier circuit 1A receives the detection signals S1, S2 as an input and operates with the gain value GT1.

Then, at Step S13, a standby process continues until a correction signal generation command HSS is released. If the correction signal generation command HSS is released, the program proceeds to Step S14. During the standby process, the amplifier circuit 1A is in the normal operation condition, performing amplification operation.

At Step S14, the correction signal HS instructive of correction of the first reference value K1 is generated. The details of the procedure will be described later.

Then, at Step S15, a check is made to determine whether the error signal ERROR has been generated. If the error signal ERROR has not been generated, the program returns to Step S12, and if it has been generated, the program proceeds to Step S16.

At Step S16, troubleshooting for the amplifier circuit 1A is performed. More specifically, a notice which informs the amplifier circuit 1A is out of order is released outward and the power source is shut off as required.

Figure 10:
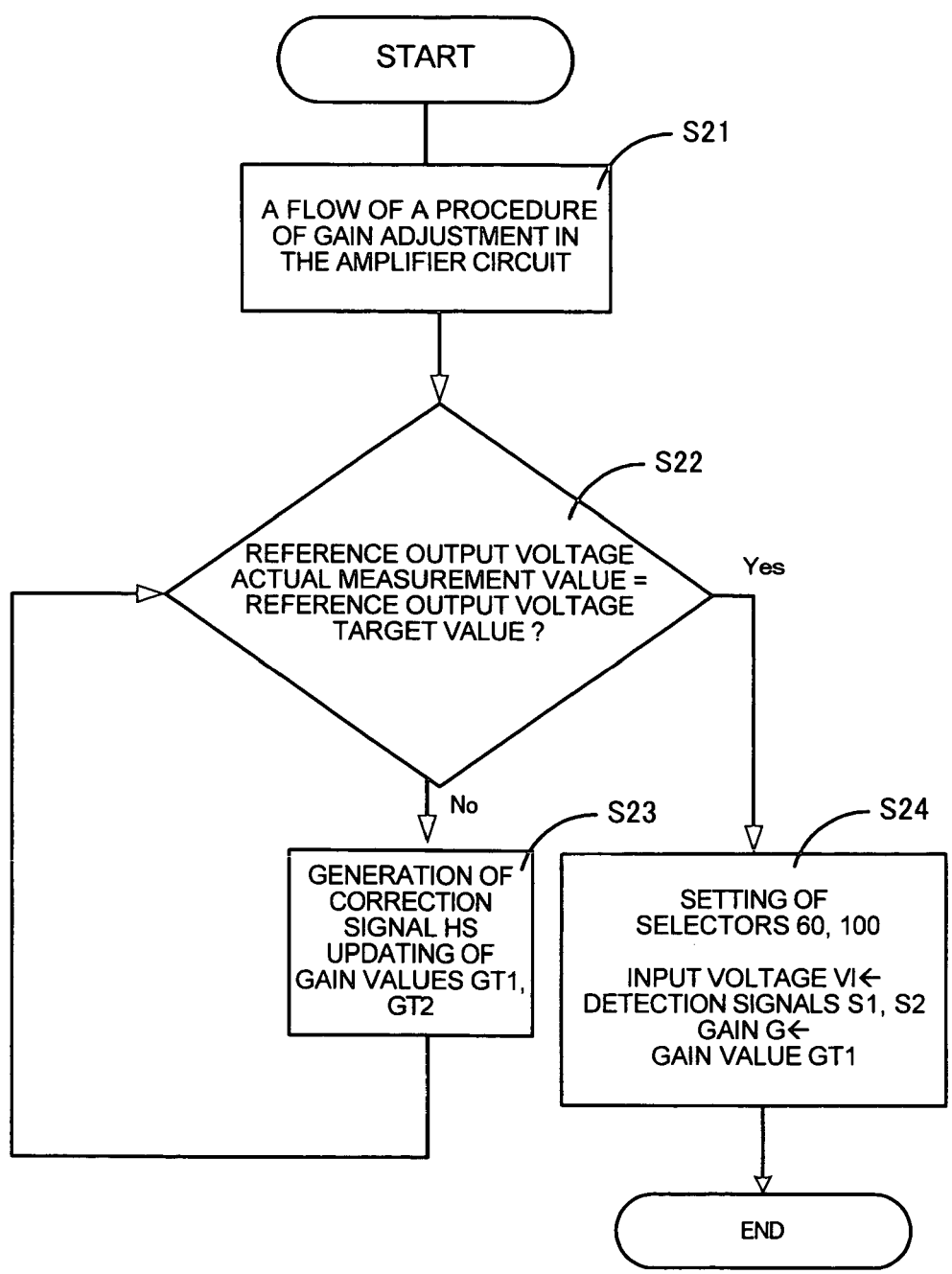
FIG. 10 is a flow of a procedure of gain adjustment in the amplifier circuit.

Next, reference is made to FIG. 10 to explain a procedure for generating the correction signal HS at Step S14 described earlier.

First, at Step S21, the selector 60 is switched such that the reference voltage VAB is input to the amplifier circuit 1A, while the selector 100 is switched such that the output (the initial value is the second reference value K2) of the second up-down counter 90 is set to the gain of the amplifier circuit 1A.

Then, at Step S22, a check is made to determine whether the reference output voltage actual measurement value KSJ (the output signal SS) matches the reference output voltage target value KSM (ranging from the reference output voltage target upper limit V1 to the reference output voltage target lower limit V2).

In the first embodiment, since the reference voltage VAB=1 mV and the second reference value K2=00000 (gain G=1000), the reference output voltage target value KSM uniquely derived from the relationship between these values is set to 0.95V to 1.05V (the center value=1.0V).

If it is judged from the above determination that the reference output voltage actual measurement value KSJ matches the reference output voltage target value KSM, the program then proceeds to Step S24 to complete the procedure for generating the correction signal HS. If not, the program proceeds to Step S23.

At Step S23, the correction signal generation unit 30A generates the control outputs DOWN, UP and COUNT which constitute the correction signal HS.

In the second up-down counter 90 to which the control outputs DOWN, UP and COUNT are connected, if the reference output voltage target upper limit V1<the output signal SS, the control output DOWN goes to a high level and therefore its contents are decremented. On the other hand, if the reference output voltage target lower limit V2>the output signal SS, the control output UP goes to a high level, and therefore its contents are incremented. Specifically, the corrected gain value GT is corrected to a lower value than the second reference value K2 if the output signal SS is higher than the reference output voltage target value KSM and corrected to a higher value than the second reference value K2 if the output signal SS is lower than the reference output voltage target value KSM. Since the correction signal HS is thus controlled, the output signal SS converges on the reference output voltage target value KSM. After generation of the correction signal HS, the program returns to Step S22 to make a comparison between the reference output voltage actual measurement value KSJ and the reference output voltage target value KSM again.

At Step S24, the selector 60 is switched such that the detection signals S1, S2 are input to the amplifier circuit 1A, while the selector 100 is switched such that the output gain value GT1 is set to the gain of the amplifier circuit 1A, and then, the procedure for generating the correction signal HS is ended.

The amplifier circuit 1A of the first embodiment includes an output voltage comparator unit for comparing the reference output voltage actual measurement value KSJ with the reference output voltage target value KSM and generates the correction signal HS based on the result obtained from the output voltage comparator unit. The generation of the correction signal HS continues until the reference output voltage actual measurement value KSJ matches the reference output voltage target value KSM. That is, the output voltage value when a specified reference voltage value is input serves as the value indicative of the amplification property. Compared to current values, voltage values are easy to deal with, particularly, when making an accurate measurement of voltage or when generating a specified voltage value. Therefore, the amplifier circuit 1A can be made of a simple circuit.

The amplifier circuit 1A includes the minute voltage generation unit 70 for generating the reference voltage VAB which is input when generating the correction signal HS. Therefore, there is no need to generate the reference voltage VAB outside the amplifier circuit 1A and the gain G (amplification property) can be corrected by the amplifier circuit 1A alone. In addition, since the wiring between the reference voltage VAB and the input is short, compared to the case where the reference voltage VAB is input from outside, the adverse effect of induction noise occurring in the wiring etc. can be reduced.

In the amplifier circuit 1A, the first up-down counter 40A is updated by the correction signal HS together with the second up-down counter 90. Therefore, the correction signal HS generated for correcting the second reference value K2 can reflect upon the correction of the first reference value K1 without use of a specific circuit.

In the amplifier circuit 1A, if the correction signal HS instructive of correction to a higher value than the upper limit is input or if the correction signal HS instructive of correction to a lower value than the lower limit is input, the correction based on the correction signal HS is impossible. Therefore, generation of the correction signal HS continues endlessly and thus, an abnormal condition arises without retrieving the normal condition.

In contrast with this, the amplifier circuit 1 generates the error signal ERROR indicative of occurrence of an error. Appropriate troubleshooting processing is performed by a control unit (not shown) in response to the error signal ERROR, thereby preventing an abnormal condition.

Second Embodiment

FIG. 11 shows an amplifier circuit 1B constructed according to a second embodiment.

The configuration of the amplifier circuit 1B differs from that of the amplifier circuit 1A of the first embodiment in that the former uses a first arithmetic unit 40B and a second arithmetic unit 90B in place of the first up-down counter 40A and second up-down counter 90 of the latter and uses an A/D converter unit 35, a difference generation unit 36 and a retaining unit 37 in place of the correction signal generation unit 30A of the latter. In the following description, an explanation on the parts similar to those of the first embodiment will be simplified or skipped.

The A/D converter unit 35 consisting of a known A/D converter converts the output signal SS into a digital value and outputs a reference output voltage actual measurement digital value KSJD to the difference generation unit 36. The difference generation unit 36 consisting of a known arithmetic circuit calculates the difference between the reference output voltage actual measurement digital value KSJD and the preset reference output voltage target value KSM. The retaining unit 37 retains the result of the calculation performed by the difference generation unit 36 and outputs it as a correction signal HS2.

The first arithmetic unit 40B and the second arithmetic unit 90B consist of a known arithmetic circuit for performing addition and subtraction on two input signals. The first arithmetic unit 40B receives, as an input, the first reference value K1 output from the first reference value retaining unit 50 and the correction signal HS2 and outputs the gain value GT1. The second arithmetic unit 90B receives, as an input, the second reference value K2 output from the second reference value retaining unit 80 and the correction signal HS2 and outputs the gain value GT2.

When correcting the second reference value K2, the amplifier circuit 1A of the first embodiment changes the second up-down counter 90 by one according to the correction signal HS. Therefore, if the reference output voltage actual measurement value KSJ significantly deviates from the reference output voltage target value KSM, it takes a long time to finish the correction.

In contrast with this, the amplifier circuit 1B of the second embodiment can make a correction through a single step by addition or subtraction of the multi-valued correction signal HS2 to or from the second reference value K2. This reduces the time required for the correction.

Third Embodiment

FIG. 12 shows an amplifier circuit 1C constructed according to a third embodiment.

The configuration of the amplifier circuit 1C differs from that of the amplifier circuit 1A of the first embodiment in that the former includes a reference voltage generation unit 38 but does not have the second reference value retaining unit 80, second up-down counter 90 and selector 100 of the latter. In the following description, an explanation on the parts similar to those of the first embodiment will be simplified or skipped.

The reference voltage generation unit 38 calculates the reference output voltage target value KSM based on the first reference value K1 and the reference voltage VAB and outputs the reference output voltage target value KSM (ranging from the reference output voltage target upper limit V1 to the reference output voltage target lower limit V2) to the correction signal generation unit 30A.

Similarly to the first embodiment, the correction signal generation unit 30A compares the reference output voltage actual measurement value KSJ with the reference output voltage target upper limit V1 and the reference output voltage target lower limit V2, respectively. Based on the result of the comparison, the correction signal generation unit 30A outputs the correction signal HS.

The reference output voltage target value KSM is a voltage value uniquely obtained by multiplying the reference voltage VAB by a specified gain target value GM.

The amplifier circuit 1A of the first embodiment uses, as the gain target value GM, the second reference value K2 which is a specified fixed value. Therefore, as the reference output voltage target value KSM (ranging from the reference output voltage target upper limit V1 to the reference output voltage target lower limit V2), a fixed value obtained by multiplying the second reference value K2 by the reference voltage VAB is set.

It is also possible to use the first reference value K1 as the gain target value GM. Since the first reference value K1 is a setting determined before shipment, a fixed value cannot be preset as the reference output voltage target value KSM.

In contrast with this, in the amplifier circuit 1C of the third embodiment, the reference output voltage target value KSM can be set according to the first reference value K1, because the amplifier circuit 1C has the reference voltage generation unit 38 for calculating the reference output voltage target value KSM based on the first reference value K1 and the reference voltage VAB. Therefore, the need for the second reference value retaining unit 80 for storing the second reference value K2, the second up-down counter 90 for correcting the second reference value K2 based on the correction signal HS and the selector 100 for switching the corrected gain value GT, which are all required for the amplifier circuit 1A of the first embodiment, can be obviated, so that the portion of the amplifier circuit 1C corresponding to these parts can be simplified.

In the amplifier circuit 1C, the up-down counter 40A, which is a known up-down counter, is used for correcting the first reference value K1. Therefore, the amplifier circuit 1C can employ a simpler configuration compared to the case where an arithmetic circuit or the like for performing arithmetic operation for correction is used.

As the means for generating the reference output voltage target value KSM, a reference output voltage target value regaining unit for retaining a previously calculated reference output voltage target value KSM may be used instead of the reference voltage generation unit 38 of the third embodiment which performs calculation based on the first reference value K1 and the reference voltage VAB. In this case, for instance, when the delivery testing machine (see FIG. 1) determines and stores the first reference value K1, the calculated, reference output voltage target value KSM may be stored in the reference output voltage target value regaining unit as well.

It is apparent that the invention is not necessarily limited to the particular embodiments shown herein and various changes and modifications are made to the disclosed embodiments without departing from the spirit and scope of the invention.

For instance, it is possible for the first to third embodiments to make an offset correction by adjusting a voltage to be applied to an offset, similarly to the gain correction in which the value of feedback resistance is adjusted for the amplifying unit. The invention is equally applicable to both of the cases where only the above offset correction is made and where the gain correction and the offset correction are made at the same time.

While the first to third embodiments have been discussed in the context of amplifier circuits which use operational amplifiers as the amplifying unit, the invention is not limited to this but applicable to cases where the amplifying unit provides the same function by use of bipolar transistors and FET elements.

In the invention, the sensor and the amplifier circuit are not limited to particular configurations. The invention is apparently applicable to, for instance, cases where the sensor and the amplifier circuit are mounted on one substrate, forming a module.

According to the invention, there are provided an amplifier circuit and a control method thereof, the amplifier circuit having the capability of restricting the influence of change with time and temperature change.

What is claimed is:

1. An amplifier circuit which receives, as an input, a detection signal from a sensor and variably sets an amplification property, the circuit comprising:

a first reference value retaining unit for retaining a first reference value that sets an amplification property of the circuit, wherein, when the sensor detects a reference input condition, the first reference value sets a value of the amplification property such that an output signal of the circuit is a specified detection reference output voltage when the sensor detects a reference input condition;

a correction signal generation unit for generating a correction signal for correcting an actual measured value of the amplification property when the set value of the amplification property varies from a specified amplification property set value, where the set value of the amplification property is a measurement value of an input/output property when the specified amplification property set value is set; and a first amplification property correction unit for correcting the first reference value based on the correction signal.

2. The amplifier circuit according to claim 1, wherein said correction signal generation unit includes an output voltage comparator unit for comparing a reference output voltage actual measurement value with a reference output voltage target value, where the reference output voltage actual measurement value is an output voltage value obtained by inputting a specified reference voltage value to the input/output property when the specified amplification property set value is set and the reference output voltage target value is a voltage value uniquely derived from the relationship between the specified amplification property set value and the specified reference voltage value;

wherein the correction signal is generated based on the result of the comparison performed by the output voltage comparator unit; and wherein the generation of the correction signal continues until the reference output voltage actual measurement value matches the reference output voltage target value.

3. The amplifier circuit according to claim 2, further comprising:

a reference voltage generation unit for generating a reference voltage having said specified reference voltage value; and an input selection unit for selecting, as an input, either the detection signal from the sensor or the reference voltage and selecting the reference voltage when the correction signal is generated.

4. The amplifier circuit according to claim 2, further comprising:

a second reference value retaining unit for retaining a second reference value;

a second amplification property correction unit for correcting the second reference value based on the correction signal; and an amplification property selection unit for selectively setting, as the amplification property, either the output of the first amplification property correction unit or the output of the second amplification property correction unit and selecting the output of the second amplification property correction unit when the correction signal is generated, wherein said amplification property set value is the second reference value and said reference output voltage target value is preset, being derived from the relationship between the second reference value and the specified reference voltage value.

5. The amplifier circuit according to claim 4, wherein the first amplification property correction unit includes a first up-down counter for storing the first reference value prior to generation of the correction signal and counting up or down based on the correction signal to output a correction result; and wherein the second amplification property correction unit includes a second up-down counter for storing the second reference value prior to generation of the correction signal and counting up or down based on the correction signal to output a correction result.

6. The amplifier circuit according to claim 2, wherein said specified amplification property set value is the first reference value; and wherein the correction signal generation unit includes a reference output voltage target value generation unit for generating the reference output voltage target value through calculation based on the first reference value and the reference voltage value.

7. The amplifier circuit according to claim 6, further comprising:

a first up-down counter for storing the first reference value prior to generation of the correction signal and counting up or down based on the correction signal to output a correction result.

8. The amplifier circuit according to claim 1, further comprising:

an error signal generating unit for generating an error signal indicative of occurrence of an error, if the output of the first amplification property correction unit is a specified upper limit and the correction signal instructive of correction to a value higher than the specified upper limit is input or if the output of the first amplification property correction unit is a specified lower limit and the correction signal instructive of correction to a value lower than the specified lower limit is input.

9. A method of controlling an amplifier circuit which receives, as an input, a detection signal from a sensor and variably sets an amplification property, the method comprising the steps of:

retaining a first reference value for setting an amplification property which makes an output signal be a specified detection reference output voltage when the sensor detects a reference input condition in which a reference physical quantity is input to the sensor is detected;

generating a correction signal for reducing the difference between an amplification property actual measurement value and a specified amplification property set value, where the amplification property actual measurement value is a measurement value of an input/output property when the specified amplification property set value is set; and correcting the first reference value based on the correction signal.

10. The method of controlling an amplifier circuit according to claim 9, wherein said step of correcting the first reference value includes a step of comparing a reference output voltage actual measurement value with a reference output voltage target value where the reference output voltage actual measurement value is an output voltage value obtained by inputting a specified reference voltage value to the input/output property when the specified amplification property set value is set and the reference output voltage target value is a voltage value uniquely derived from the relationship between the amplification property set value and the specified reference voltage value; and wherein the step of correcting the first reference value continues until the reference output voltage actual measurement value matches the reference output voltage target value.

11. The method of controlling an amplifier circuit according to claim 10, further comprising the steps of:

generating a reference voltage having said specified reference voltage value; and selecting, as an input, either the detection signal from the sensor or the reference voltage and selecting the reference voltage when the correction signal is generated.

12. The method of controlling an amplifier circuit according to claim 10, further comprising the steps of:
retaining a specified second reference value;
correcting the second reference value based on the correction signal; and
selectively setting, as the amplification property, either an output generated in the step of correcting the first amplification property or an output generated in the step of correcting the second amplification property and selecting an output generated in the step of correcting the second amplification property when the correction signal is generated,
wherein said amplification property set value is the second reference value and said reference output voltage target value is preset, being derived from the relationship between the second reference value and the specified reference voltage value.

13. The method of controlling an amplifier circuit according to claim 10,
wherein said specified amplification property set value is the first reference value; and
wherein said step of generating the correction signal includes the step of calculating the reference output voltage target value based on the first reference value and the reference voltage value.

14. The method of controlling an amplifier circuit according to claim 9, further comprising the step of:
generating an error signal indicative of occurrence of an error, if the output of the first amplification property correction unit is a specified upper limit and the correction signal instructive of correction to a value higher than the specified upper limit is input or if the output of the first amplification property correction unit is a specified lower limit and the correction signal instructive of correction to a value lower than the specified lower limit is input.

* * * * *